(12) United States Patent
Leib et al.

(10) Patent No.: US 9,704,744 B2
(45) Date of Patent: Jul. 11, 2017

(54) METHOD OF FORMING A WRAP-AROUND CONTACT ON A SEMICONDUCTOR DEVICE

(71) Applicant: INTEL CORPORATION, Santa Clara, CA (US)

(72) Inventors: Jeffrey S Leib, Hillsboro, OR (US); Ralph T Troeger, Portland, OR (US); Daniel Bergstrom, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/026,822

(22) PCT Filed: Dec. 19, 2013

(86) PCT No.: PCT/US2013/076694
§ 371 (c)(1),
(2) Date: Apr. 1, 2016

(87) PCT Pub. No.: WO2015/094309
PCT Pub. Date: Jun. 25, 2015

(65) Prior Publication Data
US 2016/0254186 A1   Sep. 1, 2016

(51) Int. Cl.
| | |
|---|---|
| H01L 21/768 | (2006.01) |
| H01L 29/417 | (2006.01) |
| H01L 29/66 | (2006.01) |
| H01L 21/285 | (2006.01) |
| H01L 23/528 | (2006.01) |
| H01L 23/532 | (2006.01) |
| H01L 23/535 | (2006.01) |
| H01L 29/78 | (2006.01) |

(52) U.S. Cl.
CPC .... *H01L 21/76895* (2013.01); *H01L 21/2855* (2013.01); *H01L 21/28568* (2013.01); *H01L 21/76865* (2013.01); *H01L 21/76883* (2013.01); *H01L 23/528* (2013.01); *H01L 23/535* (2013.01); *H01L 23/53266* (2013.01); *H01L 29/41791* (2013.01); *H01L 29/66795* (2013.01); *H01L 29/785* (2013.01); *H01L 2029/7858* (2013.01)

(58) Field of Classification Search
CPC .................... H01L 21/76895; H01L 21/28568
See application file for complete search history.

(56) References Cited

U.S. PATENT DOCUMENTS

2004/0211661 A1   10/2004 Zhang et al.
2009/0068853 A1*   3/2009 Wang .................... C23C 16/045
                                                              438/788
(Continued)

FOREIGN PATENT DOCUMENTS

KR    1019990006179 A    1/1999

OTHER PUBLICATIONS

International Preliminary Report on Patentability for PCt/US2013/076694, mailed Jun. 30, 2016, 11 pages.

*Primary Examiner* — Marc Armand
(74) *Attorney, Agent, or Firm* — Jordan IP Law, LLC

(57) ABSTRACT

Techniques and methods related to forming a wrap-around contact on a semiconductor device, and apparatus, system, and mobile platform incorporating such semiconductor devices.

10 Claims, 5 Drawing Sheets

(56) References Cited

U.S. PATENT DOCUMENTS

2011/0147840 A1 6/2011 Cea et al.
2013/0288456 A1 10/2013 Lai et al.
2014/0054679 A1* 2/2014 Tang .................... H01L 29/785
                                                                 257/329

* cited by examiner

DEPOSIT A CONTACT MATERIAL OF AN INITIAL CONTACT LAYER ON A SOURCE REGION OR DRAIN REGION OR BOTH OF AT LEAST TWO SEMICONDUCTOR BODIES SEPARATED FROM EACH OTHER BY A TRENCH AND DISPOSED OVER A SUBSTRATE
202

RE-SPUTTER THE CONTACT MATERIAL OF THE INITIAL CONTACT LAYER TO REDISTRIBUTE AT LEAST SOME OF THE CONTACT MATERIAL ONTO A PORTION OF THE SEMICONDUCTOR BODIES WITHIN THE TRENCH
204

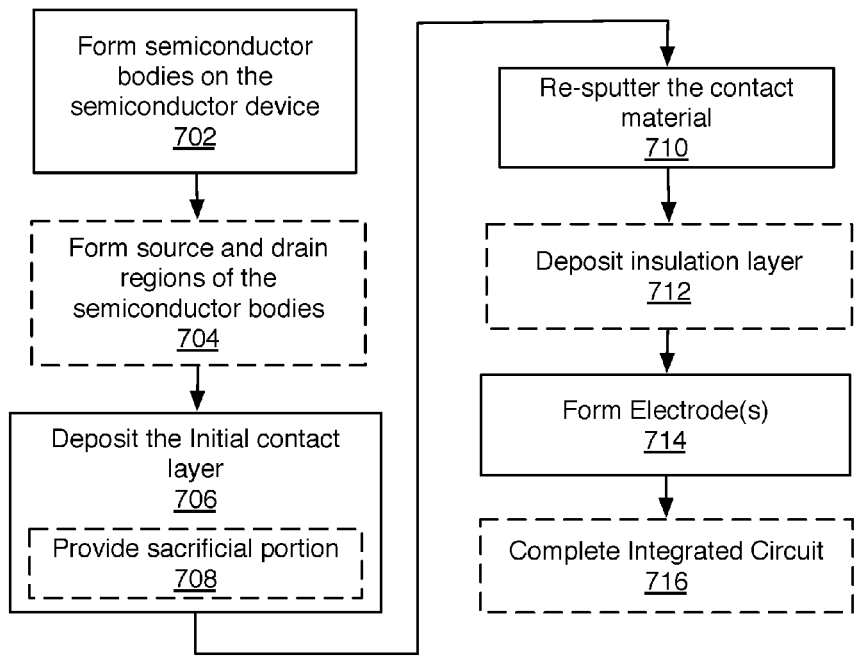

US 9,704,744 B2

METHOD OF FORMING A WRAP-AROUND CONTACT ON A SEMICONDUCTOR DEVICE

BACKGROUND

A typical metal-oxide-semiconductor field-effect transistor (MOSFET) may include a semiconductor (for example, silicon), electrodes to contact a source region and a drain region, and an electrode to contact or couple with a gate. A FinFET is a MOSFET built around a thin strip of semiconductor material (generally referred to as the fin) extending upward from a plate shaped substrate. One end of the fin is the source region, while the opposite end of the fin is the drain region. The middle area of the fin forms a channel region which is covered by a gate dielectric and a gate electrode. The conductive channel of the device resides on the outer sides of the fin beneath the gate dielectric. Specifically, current runs along and within both sidewalls of the fin (the sides perpendicular to the substrate surface) as well as along the top of the fin (the side parallel to the substrate surface). Because the conductive channel of such configurations essentially resides along the three different outer, planar regions of the fin, such a FinFET is sometimes referred to as a trigate FinFET. Other types of FinFET configurations are also available, such as so-called double-gate FinFETs, in which the conductive channel principally resides only along the two sidewalls of the fin (and not along the top of the fin). A complimentary metal-oxide semiconductor (CMOS) has dual fins, one fin for a p-type transistor (the PMOS), and another fin for an n-type transistor (the NMOS). The dual fins are separated by an insulating oxide layer on an integrated circuit for example. Both the source and drain regions of each fin may be covered with a contact connected to drive circuitry that delivers a drive current to and from the source and drain regions. The drive current at the fin and conducted through the contacts at the source and drain regions still may be increased.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2 is a flow chart for fabricating the semiconductor devices;

FIG. 7 is another flow chart for fabricating the semiconductor devices;

DETAILED DESCRIPTION

Figure 1:
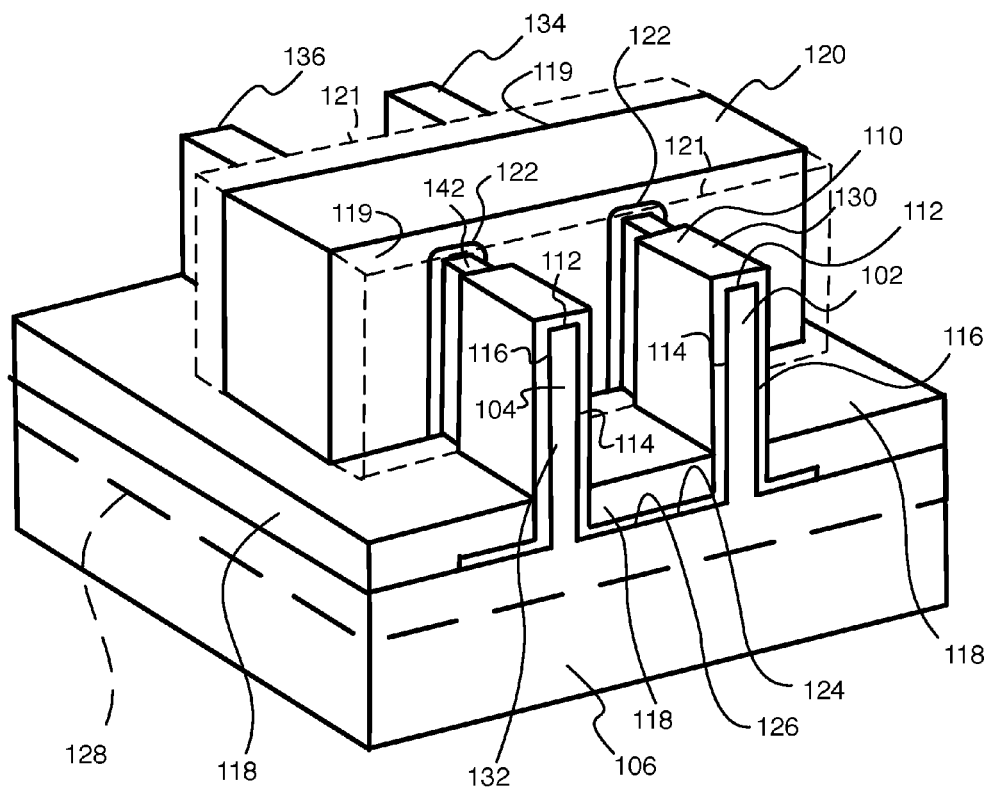
FIG. 1 is an upper perspective view of a dual complimentary metal-oxide semiconductor device.

One or more implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other implementations may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an implementation" or "in one implementation" means that a particular feature, structure, function, or characteristic described in connection with the implementation is included in at least one implementation of the invention. Thus, the appearances of the phrase "in an implementation" in various places throughout this specification are not necessarily referring to the same implementation of the invention. Furthermore, the particular features, structures, functions, or characteristics may be combined in any suitable manner in one or more implementations. For example, a first implementation may be combined with a second implementation anywhere the two implementations are not specified to be mutually exclusive.

The terms "coupled" and "connected," along with their derivatives, may be used herein to describe structural relationships between components. It should be understood that these terms are not intended as synonyms for each other. Rather, in particular implementations, "connected" may be used to indicate that two or more elements are in direct physical or electrical contact with each other. "Coupled" my be used to indicate that two or more elements are in either direct or indirect (with other intervening elements between them) physical or electrical contact with each other, and/or that the two or more elements co-operate or interact with each other (for example, as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Additionally, the terms "under" or "over" or "down" or "up" and/or similar terms relating to relative position are meant to express internal relative positioning between components and do not necessarily mean upward or downward relative to the earth unless stated otherwise.

Devices, microprocessors, apparatuses, computing platforms, and methods are described below related to forming a wrap-around contact on a semiconductor device.

Many semiconductor devices have multiple fins, which may be positioned relatively close to each other on a wafer. One such example is a complementary metal oxide semiconductor (CMOS) device that may have dual fins including a p-type fin adjacent an n-type fin separated by an insulation layer. The CMOS may be adjacent other CMOS devices such that a fin on one device is relatively close to a fin on another device. The source and drain regions on the fins are often covered by a contact for applying a drive current. Increasing the area that the contact covers, and at a sufficient thickness to correctly set the junction workfunction, reduces the contact resistance thereby increasing the drive current when the source and drain have the same voltage. When more current passes through the contact, the transistor is more efficient, and the total power for operating the transistor may be reduced or the drive current may be increased.

On a 3-D tri-gate transistor with fins such as a CMOS and other integrated circuits, upstanding fins may be separated by a trench that may be at least partially filled with an insulating material. The fins are referred to as tri-gate or 3-D because the top surface and both opposite sidewalls of the fin each form a gate (each surface is a gate). The source and drain regions of the fin may generally maintain the fin-like shape with a top and two sidewalls, and the contact material may be placed over the fin at these regions. Contact material may be deposited either before or after the insulation material is deposited in the trenches. The contact material is often deposited using physical sputtering, which is a line of sight deposition. This makes it difficult to provide sufficient contact material on the sidewalls of the fins within the trenches in order to efficiently expand the area of the contact to all three surfaces of the fins. Specifically, the sputtered material is aimed directly toward the top of the fins (where the top of the fins are normal or flat relative to the direction of sputter). Thus, fin sidewalls will not receive sufficient metal thickness to adequately set the junction workfunction, and the current flow is largely restricted to the area on the top of the fin.

The method described herein solves this difficulty by sputtering an initial contact layer onto the fins (also referred to herein as the upstanding or upwardly extending semiconductor bodies). Then a resputtering operation is performed to redistribute contact material of the initial contact layer onto the sidewalls of the semiconductor bodies. This provides a sufficient, more uniform, thickness of the contact on the sidewalls of the semiconductor bodies to provide a significant increase in drive current through the contact layer.

Referring to FIG. 1, various implementations described herein overcome the difficulties mentioned above, and in one illustrated example, an integrated circuit may have a transistor or semiconductor device 100 provided with upstanding or upwardly extending semiconductor bodies 102 and 104, also referred to as semiconductor fins, fin portions, or cores. It should be noted that for the purposes of the method described herein the semiconductor body is not necessarily limited to a fin shape where its height is greater than its width, and so forth. The semiconductor bodies 102 and 104 may be provided over a wafer or substrate 106, made of silicon (Si) in this example. The semiconductor bodies 102 and 104 may be made of Si, SiGe, or Ge. In one form, the semiconductor bodies 102 and 104 are substantially a uniform material with a semiconductor material at the core of the fin or semiconductor body. In other alternatives, the fins or semiconductor bodies may have different layers which may include a semiconductor layer and/or a semiconductor core. In either case, the semiconductor bodies conduct current in a channel direction along the length of the fin or semiconductor body generally transverse to the height of the fin or semiconductor body (or in other words between the source region 130 or 132 and drain region 134 or 136 in FIG. 1).

More specifically, semiconductor device 100 may be formed on a wafer, and in some forms may constitute one die, or a part of a die, of many dies of a wafer. The semiconductor device may be one of a plurality of semiconductor devices on the wafer whether tens, hundreds, thousands, millions, or billions of semiconductor devices on the wafer. Also, the semiconductor device 100 may be a transistor or other electronic component, and may part of an integrated circuit formed by the wafer, or may be singulated to form a discrete chip. Semiconductor device 100 may be a microelectronic device included in any device having a circuit with a logic gate electrode, such as a metal-oxide semiconductor field-effect transistor (MOSFET) gate electrode (such as, logic circuitry). For example, microelectronic device 100 may be a microprocessor, a static random access memory (SRAM) circuit, or a portion of an SRAM cache memory of a microprocessor, or the like to name a few non-limiting examples.

Semiconductor device 100 may be a non-planar, 3-D finFET with at least one p-type semiconductor body or fin 102 and at least one n-type semiconductor body or fin 104. The fins may be arranged in many different orientations on the wafer. Thus, in one form, fins of like carrier charge may be grouped together, or alternatively, or additionally, fins of different carrier charges may be alternating or paired with one p-type fin adjacent an n-type fin as with complementary metal-oxide semiconductors (CMOS). Thus, the semiconductor device may be part of an integrated circuit with many such semiconductor devices, or may be an isolated semiconductor device on the integrated circuit. Otherwise, the semiconductor device may be on its own chip or die for example. With the integrated circuit, the semiconductor device may still be isolated where a dual pair of single p-type or n-type fin have their own gate without any relatively near semiconductor devices on the circuit, or the semiconductor device may be nested within a long line or 2D network of similar, parallel semiconductor devices.

Thus, the basic transistor elements of the semiconductor device 100 include, as mentioned above, the substrate 106, upstanding semiconductor bodies or fins 102 and 104 formed over or on the substrate 106, and that are separated by an insulation layer 118 (also referred to as trench isolation or simply insulation or an isolation). It also may be a semiconductor on insulator (SOI) structure or may have a semiconductor trench insulation (STI) structure. The semiconductor devices 102 and 104 may be formed as extensions of the substrate or may be part of an additional, separate substrate layer 128 shown in dashed line. A gate electrode 120 extends over, and transverse to, the semiconductor bodies 102 and 104. Dielectric layers 122 may be disposed over channel regions of the semiconductor bodies 102 and 104 and underneath the gate electrode 120. The semiconductor bodies 102 and 104 also have source regions 130 and 132, and drain regions 134 and 136. A contact or contact layer 110 is positioned over each source and drain region. The contact may be connected to a power source by way of metal interconnects and vias.

The semiconductor device 100 may be an isolated transistor where there is one gate electrode between trench isolation along the current flow direction. Otherwise, the semiconductor device 100 may be a portion of an elongated circuit in the fin direction. In other words, in the current flow (or along the fin) direction, nested transistors may be provided where a single fin contains more transistors between the trench isolation.

The semiconductor bodies may or may not have cladding layers, which may be maintained at the channel region, and/or may extend to the source and drain regions. In this case, the contact 110 may cover the cladding layer as well as the semiconductor bodies 102 and 104 thereunder, and at the source and drain regions. 130, 132, 134, and 136.

Each semiconductor body has a top or upper surface 112 and opposite sidewalls 114 and 116 that extend transverse to the top 112 and from a bottom 124 of a trench 126 formed between the semiconductor bodies 102 and 104.

The contact layer 110 may extend over all three sides of the semiconductor bodies 102 and 104, and along the bottom 124 of the trench 126. The contact layer may be continuous over any number of aligned or arrayed semiconductor bodies. Those semiconductor bodies at the end of a wafer or that are relatively isolated from an adjacent semiconductor body where the trench may flatten out, may have the contact layer end as it extends away from the semiconductor body and before reaching the end of the wafer or the contact at an adjacent semiconductor body.

Referring now to FIG. 2, a method 200 of forming a wrap-around contact for a semiconductor device, and more particularly to the use of a resputtering operation to form a contact layer with a more uniform thickness on all three sides of the semiconductor bodies is arranged in accordance with at least some implementations of the present disclosure. In the illustrated implementation, process 200 may include one or more operations, functions or actions as illustrated by one or more of operations 202 and 204. Implementations herein, however, may include any number of operations such that some of the operations may be skipped or the like. Further, various implementations may include additional operations not shown for the sake of clarity. Also, in general, with the techniques described with respect to FIG. 2, process 200 provides an example method for forming the semiconductor structure of any of the implementations herein; however, other methods may be available for forming such structures.

The process 200 may include an operation "DEPOSITING A CONTACT MATERIAL OF AN INITIAL CONTACT LAYER ON A SOURCE REGION OR DRAIN REGION OR BOTH OF AT LEAST TWO SEMICONDUCTOR BODIES SEPARATED FROM EACH OTHER BY A TRENCH AND DISPOSED OVER A SUBSTRATE" 202. As mentioned below, the initial contact layer may be mainly deposited on the top of the semiconductor bodies and the bottom of the trenches.

The process 200 also may include an operation "RESPUTTERING THE CONTACT MATERIAL OF THE INITIAL CONTACT LAYER TO REDISTRIBUTE AT LEAST SOME OF THE CONTACT MATERIAL ONTO A PORTION OF THE SEMICONDUCTOR BODIES WITHIN THE TRENCH" 204. In one particular example, the contact material may be bombarded by a plasma with wafer bias so that the impact of the plasma on the contact material at the bottom of the trench and the top of the semiconductor bodies causes at least part of the contact material to move to the sidewalls of the semiconductor bodies.

Figure 3:
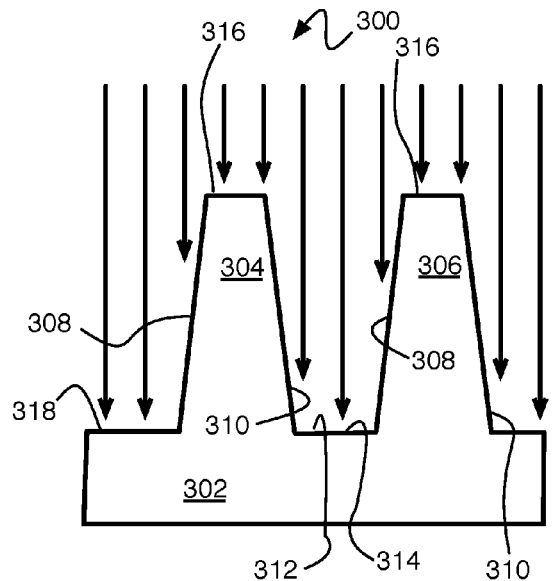
FIGS. 3-6 are cross-sectional views of example semiconductor devices as particular fabrication operations are performed.

Referring now to FIGS. 3-7, a detailed process 700 is explained in conjunction with the semiconductor device 300 shown at FIGS. 3-6 in various states during fabrication of the semiconductor bodies, such as for semiconductor device 100. The cross-sections extend generally parallel to the gate electrode and transverse to the semiconductor bodies (or fins) to provide a section through the source or drain regions of each of the semiconductor bodies shown. Referring to FIG. 3, in an initial stage, the operation 700 may include "form semiconductor bodies on the semiconductor device" 702. The semiconductor device 300 may initially have a semiconductor wafer or substrate 302, similar to substrate 106 for instance, and may be composed of undoped monocrystalline silicon (Si) in some forms. While the semiconductor substrate 302 here is an intrinsic (for instance, undoped) silicon substrate, in other forms the substrate 302 may be doped to a p type or n type conductivity.

The semiconductor bodies 304 and 306 may be made of Si, SiGe, or Ge, and each semiconductor body may have a sidewall 308 and 310 extending from a bottom 312 of a trench 314 up to a top or upper surface 316 of the semiconductor body 304 or 306. Due to manufacturing tolerances, the sidewalls 308 and 310 may or may not extend completely perpendicular to the upper surface 318 of the substrate 302, and may be approximately transverse, and in the illustrated form, may have an angle of about 10 degrees. At least initially, the semiconductor bodies 304 and 306 may be formed in a continuous line of the same material to form the source, channel, and drain region of the semiconductor body for each device or transistor. By one approach, the semiconductor bodies or fins 304 and 306 may be about 30 to 70 nm high.

The process 700 may continue with "form source and drain regions of the semiconductor bodies" 704. This may include finalizing the source and drain regions as needed including any material etching, diffusion, material replacement, and so forth to provide the source and drain regions with a desired material if it is to be different from the channel region of the semiconductor bodies 304 and 306. This operation may also include doping such as by using implantation and annealing or indiffusion from a solid source. The source and drain regions may then be doped appropriately to obtain the desired p-type or n-type semiconductor body. By one approach, the source/drain regions have a doping concentration of between approximately $1 \times 10^{19}$ to $1 \times 10^{21}$ atoms/cm$^3$, and in one form, at least approximately $5 \times 10^{20}$ atoms/cm$^3$. The source/drain regions can be formed of uniform concentration or can include sub-regions of different concentrations or doping profiles, such as tip regions (for example, source/drain extensions). In one form, when semiconductor device 100 or 300 is a symmetrical transistor, the source and drain regions will have the same doping concentration profile. In another form, transistor 100 or 300 is an asymmetrical transistor, and the source region and drain region may have varied doping in order to obtain particular electrical characteristics.

Referring to FIG. 3, process 700 may then continue with "deposit the initial contact layer" 706. This may include using radio frequency physical vapor deposition (RFPVD) in a sputter chamber such as the Applied Materials "Aura" PVD deposition chamber. In this process, a plasma gas, such as argon, is entered into the chamber under vacuum and bombarded onto a titanium target plate held at a certain distance opposing the wafer or substrate 302 holding the semiconductor device(s). The bombarded of titanium ions and atoms are directed in straight, line-of-sight fashion to the semiconductor devices held on a pedestal in the chamber. Power for deposition is provided both by a 40 MHz RF generator between 2000 W and 7500 W, and by a DC generator between 500 and 2500 W. Deposition is performed between 50 and 100 mTorr at approximately room temperature.

The initial sputter operation may also include "provide sacrificial portion" for the initial contact layer. Thus, as shown on FIG. 4, an initial contact layer 400 may include sacrificial portions 402 at the top of the semiconductor bodies 304 and 306, and sacrificial portions 404 at the bottom of the trenches. Sufficient contact material 406 may be sputtered so that the total height of the initial contact layer at the top of the semiconductor body 304 or 306, and at the bottom of the trench 314, is about 3 to 15 nm tall, including a sacrificial portion that is about 5 to 10 nm tall, when this operation is complete. The sacrificial portion may be about 10 to 20 nm tall prior to the resputtering portion of layer deposition.

Figure 4:
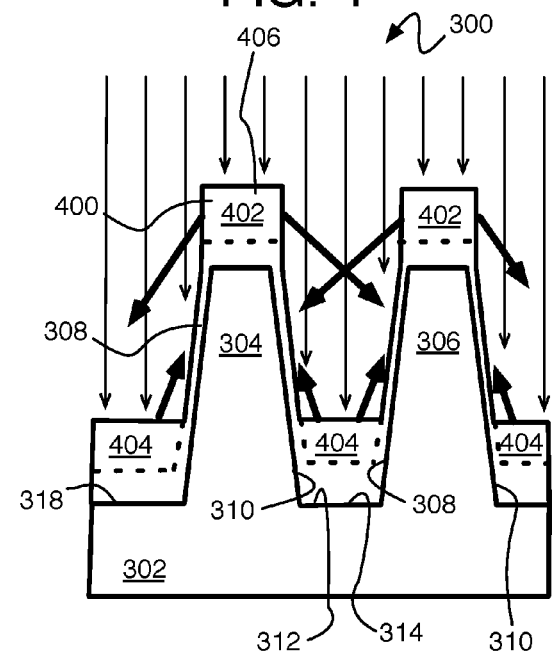

In the next operation of "re-sputter the contact material" 710, the chamber is refilled with the plasma, or argon gas, but this time without significant voltage applied between the target plate and the pedestal. Bias for resputtering is provided by a 13.56 MHz generator with 100 W-1000 W RF power, and resputtering is performed between 1 and 10 mTorr. As shown in FIG. 4, the plasma will be directed toward the semiconductor device 300, and as shown by the thick arrows, the impact of the argon ions on the metal initial contact layer will cause the contact material, such as in atom or ion form, to redistribute, and this includes motion or redistribution toward the sidewalls 308 and 310. The plasma is directed toward the semiconductor device because the bias reverses the voltage between the target electrode and wafer, so the Ar plasma is directed at the wafer instead (or in other words, the wafer becomes the target).

Thus, with this operation, the method 700 uses extra sputtered metal as the protection or sacrificial layer 402 or 404 to avoid sputtering (or in other words, etching away) the semiconductor bodies 304 or 306. This is necessary due to the physical nature of the resputtering. Physical resputtering rate will increase in areas of high curvature, such as the top corners of the semiconductor bodies 304 or 306, and will not be selective to the Si, SiGe, or Ge in those bodies. In the present example, the resputtering will etch away 10 nm of the initial contact layer, and deposit about 1 to 5 nm of contact material at the sidewalls 308 and 310.

Figure 5:
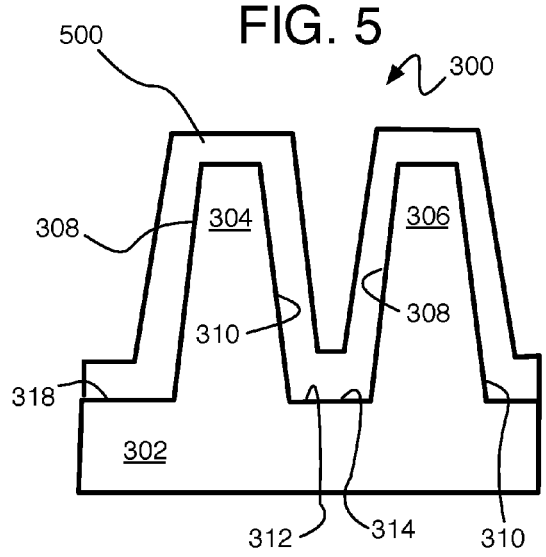

As shown on FIG. 5, the resulting resputter-formed contact layer (or subsequent or final contact layer) 500 is substantially more uniform than from the initial contact layer 402. This provided about a 10-20% increase in drive power provided to the semiconductor bodies 304 and 306 compared to the identical structure covered with PVD deposition alone. This increase will be proportional to the semiconductor body area that was previously uncovered.

Figure 6:
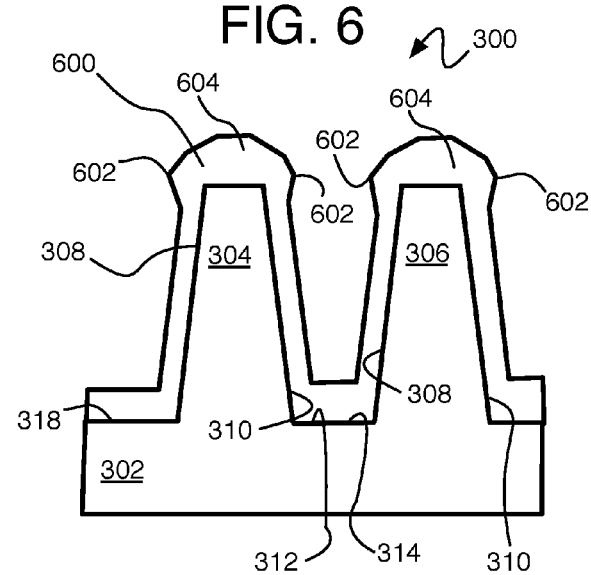

Referring to FIG. 6, an alternative resputtered contact layer 600 is shown that may more accurately depict the final profile of the contact layer 600. In this case, the resputtering forms a slight overhang 602 and rounded upper surface 604. This profile is characteristic of the resputter process, due to the vectors of physically resputtered atoms and their re-attachment to the existing structure.

Process 700 may then proceed with "deposit insulation layer" 712, such as trenches 312 when desired, such as with shallow trench isolation (STI) regions may be deposited on the contact layer 500 or 600 in the trenches 312, and may be formed of a dielectric or electrically insulative material. The electrically insulative material may include any suitable material for shallow trench isolation (STI). In some forms, the electrically insulative material for the insulation layer may include dielectric materials known for their applicability in integrated circuit structures, such as low-k dielectric materials. Examples of dielectric materials that may be used for insulation layer 402 include, but are not limited to, silicon oxide, carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass.

Contact to back-end vias and interconnects is then facilitated by deposition of a low resistance contact metal such as Al, W, Co, or Cu, and then planarized to the isolation to create individual, filled contact trenches.

The process 700 may continue with an operation to "form electrodes" 714. Thus, a gate may also be formed and may include a gate dielectric such as gate dielectric 122 (FIG. 1) and a gate electrode 120 (FIG. 1). This may include forming the gate dielectric layer 122 at the channel regions of the semiconductor bodies. The gate electrode 120 may be formed on the gate dielectric 122, and may be composed of at least one p-type workfunction metal or n-type workfunction metal, depending on whether the transistor is to be a PMOS (for example, p-type) or an NMOS (for example, n-type) transistor. By one form, gate electrode 120 is formed to a thickness sufficient to completely cover or surround the channel regions of the semiconductor bodies 102 and 104, and gate dielectric layers 122 as shown in FIG. 1.

In some forms, a pair of spacers 121 (shown roughly in dashed line) may bracket the gate electrode 120, for example, on opposing surfaces of the sidewalls 119 of the gate electrode 120 (the sides where the fins are intersecting the gate electrode 120). The spacers may be formed from a material such as silicon nitride, silicon oxide, silicon carbide, silicon nitride doped with carbon, and silicon oxynitride. Processes for forming spacers may generally include deposition and etching processes and/or other well-known techniques. The sacrificial layer described herein will also protect the spacers from physical impact from the resputter operation during contact metal deposition because the spacers are also exposed to the sputtering process. Thus, if an insufficient sacrificial metal layer from the initial contact deposition covers the spacer, the resputtering process can resputter the spacer material as well. This is true even though the spacer is positioned on the relatively vertical sidewalls of the gate electrode 120.

The process 700 also optionally includes "complete integrated circuit" 716 when the semiconductor device 100 or 300, for example, is one of many such devices for an integrated circuit rather than as an isolated transistor. In this case, "back end" techniques can be utilized to form metal contacts, metallization layers and interlayer dielectrics to interconnect various transistors together into functional integrated circuits, such as microprocessors.

While implementation of example process 200 and 700, may include the undertaking of all operations shown in the order illustrated, the present disclosure is not limited in this regard and, in various examples, implementation of processes 200 and 700 may include the undertaking of only a subset of the operations shown, operations can be combined together or sub-divided, and/or in a different order than illustrated.

In addition, any one or more of the operations of FIGS. 2 and 7 may be undertaken in response to instructions provided by one or more computer program products. Such program products may include signal bearing media providing instructions that, when executed by, for example, a processor, may provide the functionality described herein. The computer program products may be provided in any form of one or more computer readable media. Thus, for example, a processor including one or more processor core(s) may undertake one or more of the example operations shown in FIGS. 2 and 7 in response to program code and/or instructions or instruction sets conveyed to the processor by one or more machine-readable media. In general, a machine-readable medium may convey software in the form of program code and/or instructions or instruction sets that may cause any of the devices and/or systems to perform as described herein.

Figure 8:
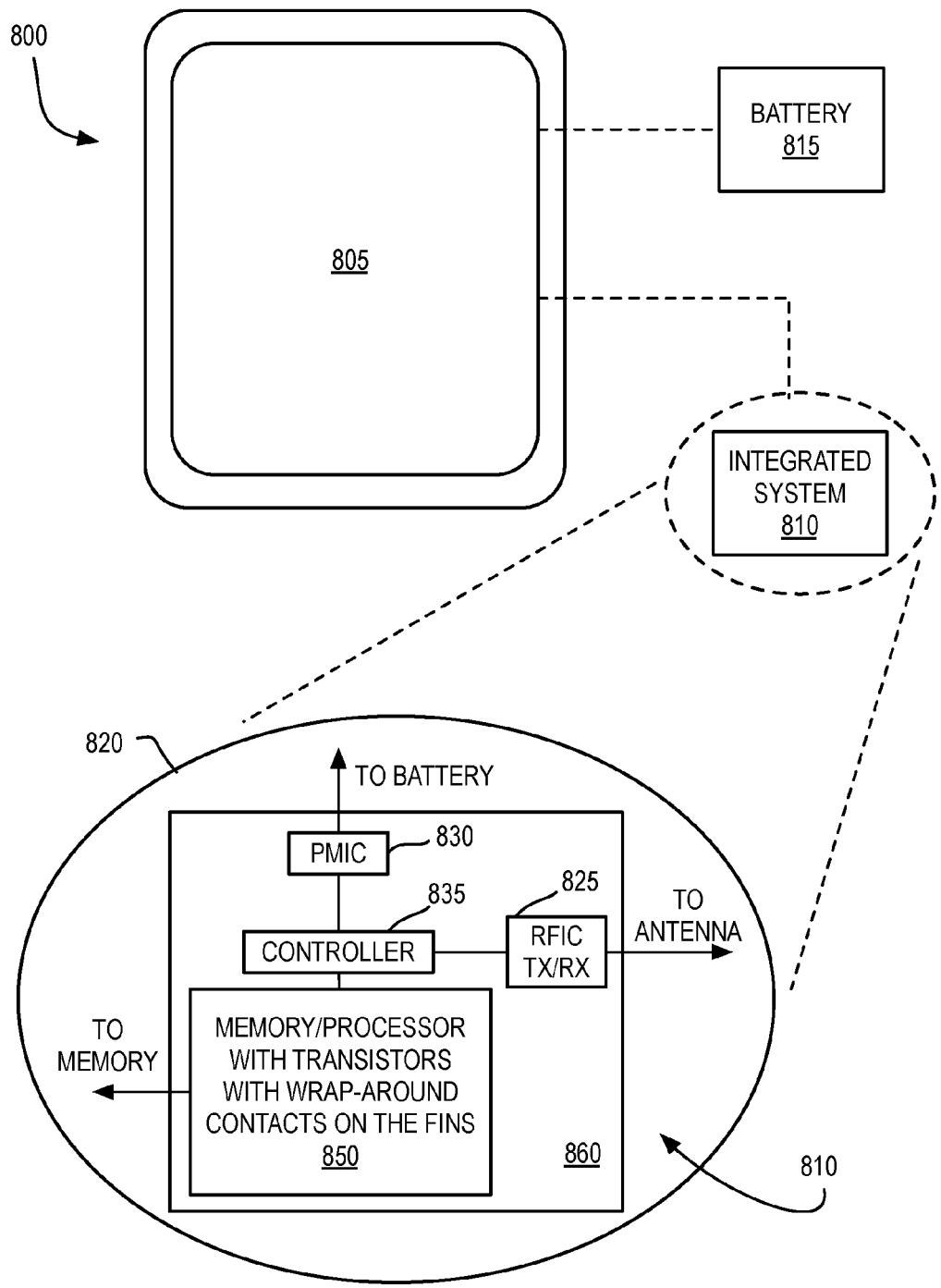
FIG. 8 is an illustrative diagram of a mobile computing platform employing an integrated circuit with transistors having a wrap-around contact on fins of the transistor.

FIG. 8 is an illustrative diagram of a mobile computing platform employing an IC with transistors having an unrecessed field insulator and thinner electrodes over the field insulator, arranged in accordance with at least some implementations of the present disclosure. Mobile computing platform 800 may be any portable device configured for each of electronic data display, electronic data processing, wireless electronic data transmission, or the like. For example, mobile computing platform 800 may be any of a tablet, a smart phone, laptop computer, etc. and may include a display screen 805, which in the exemplary implementation is a touchscreen (for example, capacitive, inductive, resistive, etc. touchscreen), a chip-level (SoC) or package-level integrated system 810, and a battery 815.

Integrated system 810 is further illustrated in the expanded view 820. In the exemplary implementation, packaged device 850 (labeled "Memory/Processor with Wraparound Contacts on the Fins" in FIG. 8, and according to the implementations described herein) includes at least one memory chip (for example, RAM), and/or at least one processor chip (for example, a microprocessor, a multi-core microprocessor, or graphics processor, or the like) employing transistors with p-type and n-type cladded fins as discussed herein. In an implementation, the package device 850 is a microprocessor including an SRAM cache memory employing transistors with p-type and n-type cladded fins as discussed herein (for example, the SRAM cache memory may include an inverter circuit employing transistors as discussed herein).

An employed transistor may include a semiconductor device with a substrate, a strained layer forming both p-type and n-type semiconductor bodies such as fins, and cladding layers over or on at least the n-type semiconductor bodies, where the cladding layers are grown as described herein. Packaged device 850 may be further coupled to (for example, communicatively coupled to) a board, a substrate, or an interposer 860 along with, one or more of a power management integrated circuit (PMIC) 830, RF (wireless) integrated circuit (RFIC) 825 including a wideband RF (wireless) transmitter and/or receiver (TX/RX) (for example, including a digital baseband and an analog front end module further comprises a power amplifier on a transmit path and a low noise amplifier on a receive path), and a controller thereof 835. In general, packaged device 850 may be also be coupled to (for example, communicatively coupled to) display screen 805.

Functionally, PMIC 830 may perform battery power regulation, DC-to-DC conversion, etc., and so has an input coupled to battery 815 and with an output providing a current supply to other functional modules. As further illustrated, in the exemplary implementation, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 850 or within a single IC (SoC) coupled to the package substrate of the packaged device 850.

Figure 9:
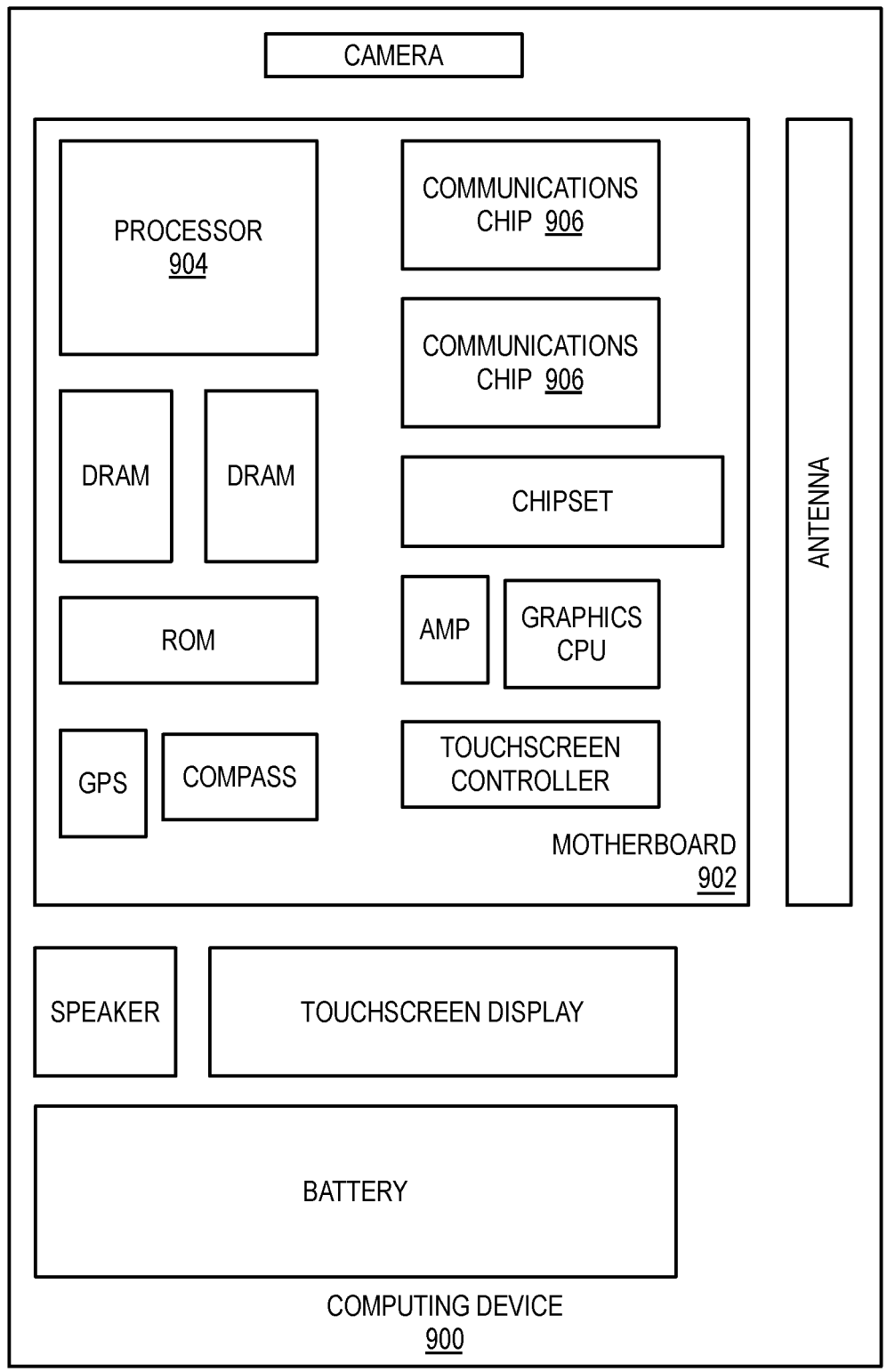
FIG. 9 is a functional block diagram of a computing device, all arranged in accordance with at least some implementations of the present disclosure.

FIG. 9 is a functional block diagram of a computing device 900, arranged in accordance with at least some implementations of the present disclosure. Computing device 900 may be found inside platform 800, for example, and further includes a motherboard 902 hosting a number of components, such as but not limited to a processor 904 (for example, an applications processor), which may incorporate transistors with cladded p-type and n-type semiconductor bodies as discussed herein, and at least one communication chip 906. In implementations, at least one of the processor 904, one or more communication chips 906, or the like may be physically and/or electrically coupled to motherboard 902. In some examples, processor 904 includes an integrated circuit die packaged within the processor 904. In general, the term "processor" may refer to any device or portion of a device that processes electronic data from registers and/or memory to transform that electronic data into other electronic data that may be stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (for example, DRAM), non-volatile memory (for example, ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth), or the like.

Communication chips 906 may enables wireless communications for the transfer of data to and from the computing device 900. The term "wireless" and its derivatives may be used to describe circuits, devices, systems, methods, techniques, communications channels, and so forth that may communicate data through the use of modulated electromagnetic radiation through a non-solid medium. The term does not imply that the associated devices do not contain any wires, although in some implementations they might not. Communication chips 906 may implement any of a number of wireless standards or protocols, including but not limited to those described elsewhere herein. As discussed, computing device 900 may include a plurality of communication chips 906. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software logic and/or firmware logic configured to provide the functionality described herein. The software may be embodied as a software package, code and/or instruction set, and/or firmware that stores instructions executed by programmable circuitry. The modules may, collectively or individually, be embodied for implementation as part of a larger system, for example, an integrated circuit (IC), system on-chip (SoC), and so forth.

As used in any implementation described herein, the term "logic unit" refers to any combination of firmware logic and/or hardware logic configured to provide the functionality described herein. The "hardware", as used in any implementation described herein, may include, for example, singly or in any combination, hardwired circuitry, programmable circuitry, state machine circuitry, and/or firmware that stores instructions executed by programmable circuitry. The logic units may, collectively or individually, be embodied as circuitry that forms part of a larger system, for example, an integrated circuit (IC), system on-chip (SoC), and so forth. For example, a logic unit may be embodied in logic circuitry for the implementation firmware or hardware of the systems discussed herein. Further, one of ordinary skill in the art will appreciate that operations performed by hardware and/or firmware may also utilize a portion of software to implement the functionality of the logic unit.

As used in any implementation described herein, the term "engine" and/or "component" may refer to a module or to a logic unit, as these terms are described above. Accordingly, the term "engine" and/or "component" may refer to any combination of software logic, firmware logic, and/or hardware logic configured to provide the functionality described herein. For example, one of ordinary skill in the art will appreciate that operations performed by hardware and/or firmware may alternatively be implemented via a software module, which may be embodied as a software package, code and/or instruction set, and also appreciate that a logic unit may also utilize a portion of software to implement its functionality.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further implementations.

By one implementation, a method of forming a semiconductor device comprises depositing a contact material of an initial contact layer on a source region or drain region or both of at least two semiconductor bodies and separated from each other by a trench and disposed over a substrate. The method also comprises re-sputtering the contact material of the initial contact layer to redistribute at least some of the contact material onto at least one portion of the semiconductor bodies within the trench.

By other implementations, a method is provided where the semiconductor bodies have a top and sidewalls extending from, and transverse to, the top, and the depositing operation comprises depositing the initial contact layer at least on the top, and the re-sputtering redistributes the contact material onto the sidewalls. The depositing operation also comprises depositing contact material at a bottom of the trench, and where re-sputtering redistributes at least some of the contact material from the bottom of the trench onto the sidewalls of the semiconductor bodies. The method comprises forming a sacrificial portion of the initial contact layer, and redistributing the sacrificial portion during the re-sputtering of the contact material, where the sacrificial portion adds about 10-20 nm to the height of the initial contact layer, the contact material comprises titanium, and the contact layer at the sidewalls resulting after the resputtering is at least about 1-5 nm thick. Otherwise, re-sputtering comprises directing a plasma bombardment material toward the initial contact layer and on a biased wafer. The method also may comprise depositing the contact material on a surface of a spacer disposed at a gate electrode intersecting the semiconductor bodies and while depositing the contact material of the initial contact layer. The method comprises depositing a sufficient amount of the contact material on the surface of the spacer to form a sacrificial layer at the spacer to avoid damage to the spacer during re-sputtering.

By one approach, a semiconductor device comprises a substrate, at least two semiconductor bodies separated from each other by a trench and disposed over the substrate, and the semiconductor bodies have a source region and a drain region separated by a channel region, and a resputter-formed contact layer on the semiconductor bodies and formed by re-sputtering an initial contact layer at least partially redistributed to a portion of the semiconductor bodies within the trench. The device may also have a gate dielectric layer disposed over the channel region of the semiconductor bodies, and a gate electrode disposed over the gate dielectric layer.

By other approaches, the semiconductor device has semiconductor bodies that have a top and sidewalls extending from, and transverse to, the top, and where the initial contact layer is disposed at least on the top, and the resputter-formed contact layer is disposed at the sidewalls with contact material from the initial contact layer at the top. Otherwise, the semiconductor bodies have sidewalls extending from the trench, the trench has a bottom, and where the initial contact layer is disposed at the bottom of the trench, and where the resputter-formed contact layer at the sidewalls is at least partially formed from contact material from the bottom of the trench. By another aspect, the initial contact layer comprises a sacrificial portion configured and arranged to be redistributed during re-sputtering of the contact material from the initial contact layer, and the sacrificial portion adds about 10-20 nm to the height of the initial contact layer, while the resputter-formed contact layer is disposed at the sidewalls and has a thickness at the sidewalls of at least about 1-5 nm thick. Also, the contact material comprises titanium, and the re-sputter-formed contact layer is formed by a plasma bombardment material directed toward the initial contact layer and on a biased wafer. The semiconductor comprises a spacer disposed at the gate electrode, the contact material is disposed at a surface of the spacer from the depositing of the contact material of the initial contact layer, and the contact material has a sufficient amount on the surface of the spacer to form a sacrificial layer at the spacer to avoid damage to the spacer during re-sputtering.

By another aspect, a mobile computing platform comprises a microprocessor, comprises a substrate, at least two semiconductor bodies separated from each other by a trench and disposed over the substrate, and the semiconductor bodies have a source region and a drain region separated by a channel region, and a resputter-formed contact layer on the semiconductor bodies and formed by re-sputtering an initial contact layer at least partially redistributed to a portion of the semiconductor bodies within the trench. The microprocessor may also have a gate dielectric layer disposed over the channel region of the semiconductor bodies, and a gate electrode disposed over the gate dielectric layer. The platform may also have a display screen communicatively coupled to the microprocessor, and a wireless transceiver communicatively coupled to the microprocessor.

By other aspects, the platform has semiconductor bodies that have a top and sidewalls extending from, and transverse to, the top, and where the initial contact layer is disposed at least on the top, and the resputter-formed contact layer is disposed at the sidewalls with contact material from the initial contact layer at the top. Otherwise, the semiconductor bodies have sidewalls extending from the trench, the trench has a bottom, and where the initial contact layer is disposed at the bottom of the trench, and where the resputter-formed contact layer at the sidewalls is at least partially formed from contact material from the bottom of the trench. By another aspect, the initial contact layer comprises a sacrificial portion configured and arranged to be redistributed during re-sputtering of the contact material from the initial contact layer, and the sacrificial portion adds about 10-20 nm to the height of the initial contact layer, while the resputter-formed contact layer is disposed at the sidewalls and has a thickness at the sidewalls of at least about 1-5 nm thick. Also, the contact material comprises titanium, and the re-sputter-formed contact layer is formed by a plasma bombardment material directed toward the initial contact layer and on a biased wafer. The platform comprises a spacer disposed at the gate electrode, the contact material is disposed at a surface of the spacer from the depositing of the contact material of the initial contact layer, and the contact material has a sufficient amount on the surface of the spacer to form a sacrificial layer at the spacer to avoid damage to the spacer during re-sputtering.

In a further example, a microprocessor may include an SRAM cache memory further having a transistor including any one of the above example structures.

In a still further example, a mobile computing platform may include any of the example structures.

It will be recognized that the invention is not limited to the implementations so described, but can be practiced with modification and alteration without departing from the scope of the appended claims. For example, the above implementations may include specific combination of features. However, the above implementations are not limited in this regard and, in various implementations, the above implementations may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed:

1. A method of forming a semiconductor device, comprising:
    depositing a contact material of an initial contact layer on a source region or drain region or both of at least two semiconductor bodies and separated from each other by a trench and disposed over a substrate; and
    re-sputtering the contact material of the initial contact layer to redistribute at least some of the contact material onto at least one portion of the semiconductor bodies within the trench.

2. The method of claim 1 wherein the semiconductor bodies have a top and sidewalls extending from, and transverse to, the top, and wherein depositing comprises depositing the initial contact layer at least on the top, and the re-sputtering redistributes the contact material onto the sidewalls.

3. The method of claim 1 wherein depositing comprises depositing contact material at a bottom of the trench, and wherein re-sputtering redistributes at least some of the contact material from the bottom of the trench onto the sidewalls of the semiconductor bodies.

4. The method of claim 1 comprising:
    forming a sacrificial portion of the initial contact layer; and
    redistributing the sacrificial portion during the re-sputtering of the contact material.

5. The method of claim 1 wherein the contact material comprises titanium.

6. The method of claim 1 wherein the semiconductor bodies have a top and sidewalls extending transverse to the top, and wherein a contact layer at the sidewalls resulting after the resputtering is at least about 1-5 nm thick.

7. The method of claim 1 wherein re-sputtering comprises directing a plasma bombardment material toward the initial contact layer and on a biased wafer.

8. The method of claim 1 comprising depositing the contact material on a surface of a spacer disposed at a gate electrode intersecting the semiconductor bodies and while depositing the contact material of the initial contact layer, and comprising depositing a sufficient amount of the contact material on the surface of the spacer to form a sacrificial layer at the spacer to avoid damage to the spacer during re-sputtering.

9. The method of claim 1 wherein the semiconductor bodies have a top and sidewalls extending from, and transverse to, the top, and wherein depositing comprises depositing the initial contact layer at least on the top, and the re-sputtering redistributes the contact material onto the sidewalls,
    wherein depositing comprises depositing contact material at a bottom of the trench, and wherein re-sputtering redistributes at least some of the contact material from the bottom of the trench onto the sidewalls of the semiconductor bodies;
the method comprising:
    forming a sacrificial portion of the initial contact layer; and
    redistributing the sacrificial portion during the re-sputtering of the contact material,
    wherein the sacrificial portion adds about 10-20 nm to the height of the initial contact layer,
    wherein the contact material comprises titanium,
    wherein a contact layer at the sidewalls resulting after the resputtering is at least about 1-5 nm thick,
    wherein re-sputtering comprises directing a plasma bombardment material toward the initial contact layer and on a biased wafer; and
    the method comprising depositing the contact material on a surface of a spacer disposed at a gate electrode intersecting the semiconductor bodies and while depositing the contact material of the initial contact layer, and comprising depositing a sufficient amount of the contact material on the surface of the spacer to form a sacrificial layer at the spacer to avoid damage to the spacer during re-sputtering.

10. The method of claim 4 wherein the sacrificial portion adds about 10-20 nm to the height of the initial contact layer.

* * * * *